United States Patent [19]
Lo et al.

[11] Patent Number: 6,046,646
[45] Date of Patent: Apr. 4, 2000

[54] MODULATION OF A PHASE LOCKED LOOP FOR SPREADING THE SPECTRUM OF AN OUTPUT CLOCK SIGNAL

[76] Inventors: Pedro W. Lo, 141 Del Medio Ave. #124, Mountain View, Calif. 94040; Gregory J. Richmond, 833 Pear Ave., Sunnyvale, Calif. 94087

[21] Appl. No.: 09/095,784

[22] Filed: Jun. 11, 1998

Related U.S. Application Data
[60] Provisional application No. 60/049,590, Jun. 13, 1997.

[51] Int. Cl.⁷ .............................. H03D 3/09; H03L 7/087; H03L 7/089; H03L 7/093
[52] U.S. Cl. .................................. 331/10; 331/11; 331/17; 331/23
[58] Field of Search .................................. 331/10, 11, 14, 331/17, 23

[56] References Cited

U.S. PATENT DOCUMENTS

| | | | |
|---|---|---|---|
| 5,448,193 | 9/1995 | Baumert et al. | 327/156 |
| 5,455,840 | 10/1995 | Nakauchi et al. | 375/371 |
| 5,457,428 | 10/1995 | Alder et al. | 331/1 A |
| 5,488,627 | 1/1996 | Hardin et al. | 375/204 |
| 5,598,405 | 1/1997 | Hirose | 370/280 |
| 5,610,955 | 3/1997 | Bland | 331/18 |
| 5,651,035 | 7/1997 | Tozun et al. | 375/373 |

*Primary Examiner*—Siegfried H. Grimm
*Attorney, Agent, or Firm*—Townsend and Townsend and Crew LLP

[57] ABSTRACT

Apparatus and methods for controlling the frequency spectrum of a clock signal, for example, to reduce EMI emissions. A PLL circuit receives a reference signal and generates an output clock signal. A modulating circuit is coupled to the PLL and generates a modulating signal. The PLL receives the modulating signal and accordingly varies the frequency spectrum of the output clock signal.

24 Claims, 8 Drawing Sheets

MODULATION OF A PHASE LOCKED LOOP FOR SPREADING THE SPECTRUM OF AN OUTPUT CLOCK SIGNAL

CROSS-REFERENCE TO RELATED APPLICATIONS

This application is a nonprovisional application of, and claims priority from, commonly assigned U.S. provisional application Ser. No. 60/049,590, filed on Jun. 13, 1997, incorporated herein by reference.

BACKGROUND OF THE INVENTION

The present invention relates to electronic circuits and the field of frequency modulation circuits. More particularly, the present invention relates to a circuit which finely controls the frequency spectrum of a clock signal.

The demand for today's high-speed electronic equipment has created a number of problems for circuit designers and manufacturers. The high-speed electronic equipment require clocks operating at higher frequencies. The higher frequencies, in turn, increase the level of electromagnetic interference (EMI). In addition, long traces of wire on printed circuit boards further add to the EMI levels. The increased levels of EMI can negatively effect the operation of components in proximity to such high-speed circuitry due to the coupling of the radiated energy. Therefore, it is desirable to lower the unwanted EMI energy levels while increasing the speed of the electronic circuitry.

In the United States, the Federal Communications Commission (FCC) has established rules and standards regarding EMI emissions from electronic equipment. The FCC emission limitations are published in the Code of Federal Regulations. FCC also enforces these standards and levies fines against violators. Compliance with the FCC standards has become quite a challenge for most circuit board manufacturers. To add to the problem, consumers increasingly demand higher performance from the products they purchase.

One solution is to attempt to filter the high EMI emission signals. However, filtering signals at such high speeds is not practical because it tends to degrade the performance of the system. An additional solution is to utilize metal shielding to reduce the EMI levels. This solution is also impractical because it is prohibitively expensive.

Another solution used for reducing the peak energy of a clock signal is frequency modulation. FIG. 1 illustrates the energy levels of an exemplary clock signal concentrated at its fundamental frequency. A signal 102 illustrates the energy level of the clock signal at its fundamental frequency of 100 MHz. The FCC energy limit is illustrated by line 104. Signals 106 and 108 represent the energy levels of the clock signal at its third harmonic frequency of 300 MHz and fifth harmonic frequency of 500 MHz, respectively. As shown, the peak energy level at the fundamental frequency 102 is very close to the FCC limit 104.

FIG. 2 illustrates the energy levels of a frequency modulated version of the clock signal shown in FIG. 1. A signal 202 illustrates the frequency modulated version of signal 102 of FIG. 1. As illustrated, signal 202 is modulated between a value of 99 MHz and 101 MHz. The FCC energy limit is illustrated by line 204. Signals 206 and 208 illustrate the energy levels of the modulated clock signal at its third harmonic of 300 MHz and fifth harmonic of 500 MHz, respectively. As shown, signal 206 is modulated between 297 MHz and 303 MHz. Signal 208 is modulated between 495 MHz and 505 MHz.

When a clock signal is frequency modulated, its spectrum is spread over a broader frequency band. As a result, this technique reduces the peak energy level of the signal. This advantage is clearly demonstrated by comparing FIGS. 1 and 2. For example, the peak energy level of the frequency modulated version of signal 102, illustrated as signal 202 in FIG. 2, is much lower than the peak energy level of the unprocessed signal 102. As a result, frequency modulation can more readily provide compliance with the FCC requirements. In fact, in certain applications where the peak energy levels of a clock signal already surpasses the FCC limits, frequency modulation can lower these levels sufficiently to avoid violating the regulations. Therefore, frequency modulation is capable of rendering certain legally unusable circuits employable by lowering the generated EMI levels.

Moreover, the frequency modulation has to be finely tuned. Otherwise, the resulting signal will be too far from the center frequency of the original signal. If this frequency excursion is not finely controlled, the recipient circuitry can be rendered inoperable for timing reasons.

Currently, phase-locked loop (PLL) circuits are used to provide precise clock signals in a variety of applications in the electronics field. The operation of the conventional PLL is well known in the art and will not be discussed in detail herein.

FIG. 3 illustrates a conventional PLL 300. A reference input signal (Fref) is received by the PLL 300 at an input node 302. A signal divider 304 divides the input signal by a factor M and provides the divided signal at a node 306. The signal divider 304 generates an output pulse for every M input pulses. A phase/frequency detector 308 compares the phase and/or frequency of the divided signal 306 with a feedback signal provided at node 310. Outputs of the phase/frequency detector 308 are connected to a charge pump 312. The charge pump 312 includes two current source devices 313 and 314 connected in series between a voltage source 315 and a ground 316. The charge pump 312 provides a signal on node 317 to a loop filter 318 based on the phase/frequency detector 308 outputs. The loop filter 318 includes a resistor 319 and a capacitor 320 connected in series between the charge pump output node 317 and a ground potential 322. The loop filter filters the charge pump output 317 in accordance with the selected values for the resistor 319 and the capacitor 320.

The charge pump output node 317 is also connected to a voltage controlled oscillator (VCO) 324. The VCO 324 provides an output on node 326 based on the voltage value of its input signal 317 which is provided by the charge pump 312, and filtered by the loop filter 318. The output of the VCO 324 is also connected to a second signal divider 328. The second signal divider 328 is configured to divide the VCO output signal 326 by a factor N. Hence, the signal divider 328 generates an output pulse for every N input pulses. The output of the second signal divider 328 provides the feedback signal on node 310 to the phase/frequency detector 308.

As a result, the PLL 300 will provide an output at node 326 with a frequency which is equal to the frequency of its input at node 302 multiplied by a factor N/M. Also, the PLL output 326 will have the same phase as the PLL input 302 because the phase/frequency detector 308 detects any phase differences between the divided signal 306 and the feedback signal 310 to provide a correction accordingly. The PLL 300, however, can only provide a precise output signal and is unable to provide a finely controlled frequency modulated signal.

From the foregoing, it will be understood that a method and circuit for finely controlling the frequency of a clock signal is desired which will minimize the EMI levels of the clock signal, particularly for high-speed electronic equipment utilizing a higher frequency for synchronization.

SUMMARY OF THE INVENTION

The present invention provides new and improved apparatus and methods for controlling the frequency spectrum of a clock signal, for example, to reduce EMI emissions. A PLL circuit receives the clock signal and generates an output signal. A modulating circuit is coupled to the PLL and generates a modulating signal. The PLL receives the modulating signal and in accordance therewith varies the frequency spectrum of the output signal.

In one embodiment of the present invention, the frequency excursion of the output signal from a PLL can be precisely controlled by using a modulating circuit. The modulating circuit injects a modulating current into a potential storage device coupled to the PLL. The value of the stored charge in the storage device in turn controls an oscillator producing the PLL output signal.

In another embodiment, the present invention utilizes a second feedback loop around the conventional PLL and the modulating circuit to finely tune the modulating frequency spectrum. The second feedback loop provides further closed loop tuning of the modulating circuit. In particular, the second feedback loop generates a control signal based on the PLL output signal and signals generated by the modulating circuit. The feedback control signal is coupled to the modulating circuit and thereby controls the injection of the modulating current.

In yet another embodiment, the present invention utilizes a method for finely tuning and generating a frequency modulating control signal. The frequency modulating control signal is generated in accordance with the characteristics of the input clock signal and a processed version of the input signal. The frequency modulating control signal controls the frequency excursion of the output signal.

In an additional embodiment, the present invention utilizes another method to incorporate feedback information to finely tune the frequency modulation of the output signal. The characteristics of the output signal are used to produce a count signal. The count signal is compared with a modulating signal generated based on the characteristics of the input clock signal. The result of this comparison finely adjusts a modulating control signal which in turn adjusts the frequency excursion of the output signal.

For further understanding of the nature and advantages of the present invention, reference should be made to the ensuing detailed description taken in conjunction with the accompanying drawings.

DESCRIPTION OF THE SPECIFIC EMBODIMENT

Figure 1:
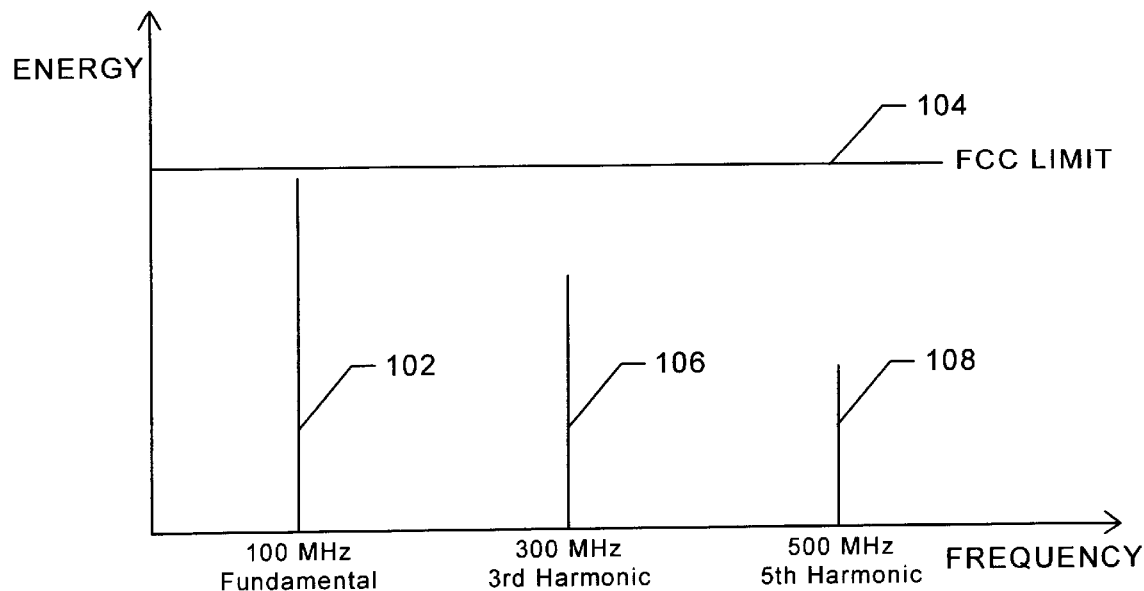
FIG. 1 is a graph illustrating the energy levels of an exemplary clock signal.
Figure 2:
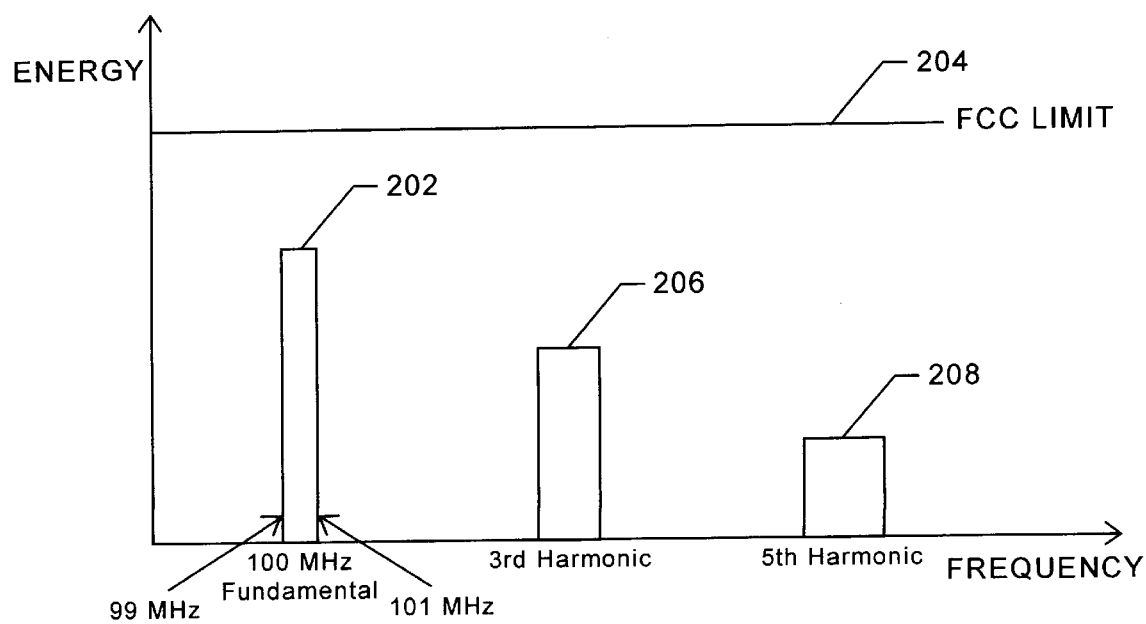
FIG. 2 is a graph illustrating the energy levels of a frequency modulated version of the clock signal shown in FIG. 1.
Figure 3:
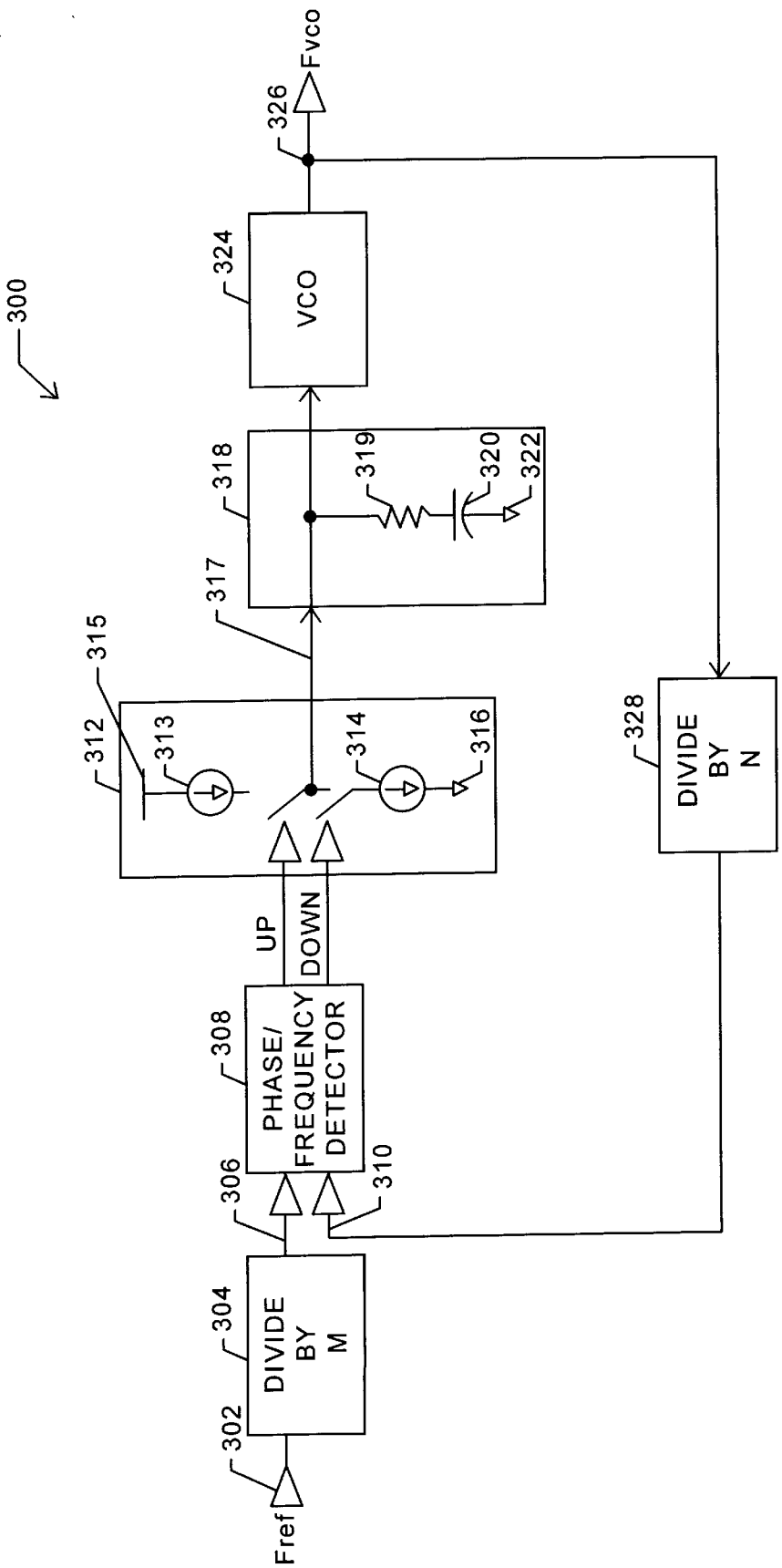
FIG. 3 is a block diagram of a conventional PLL.
Figure 4:
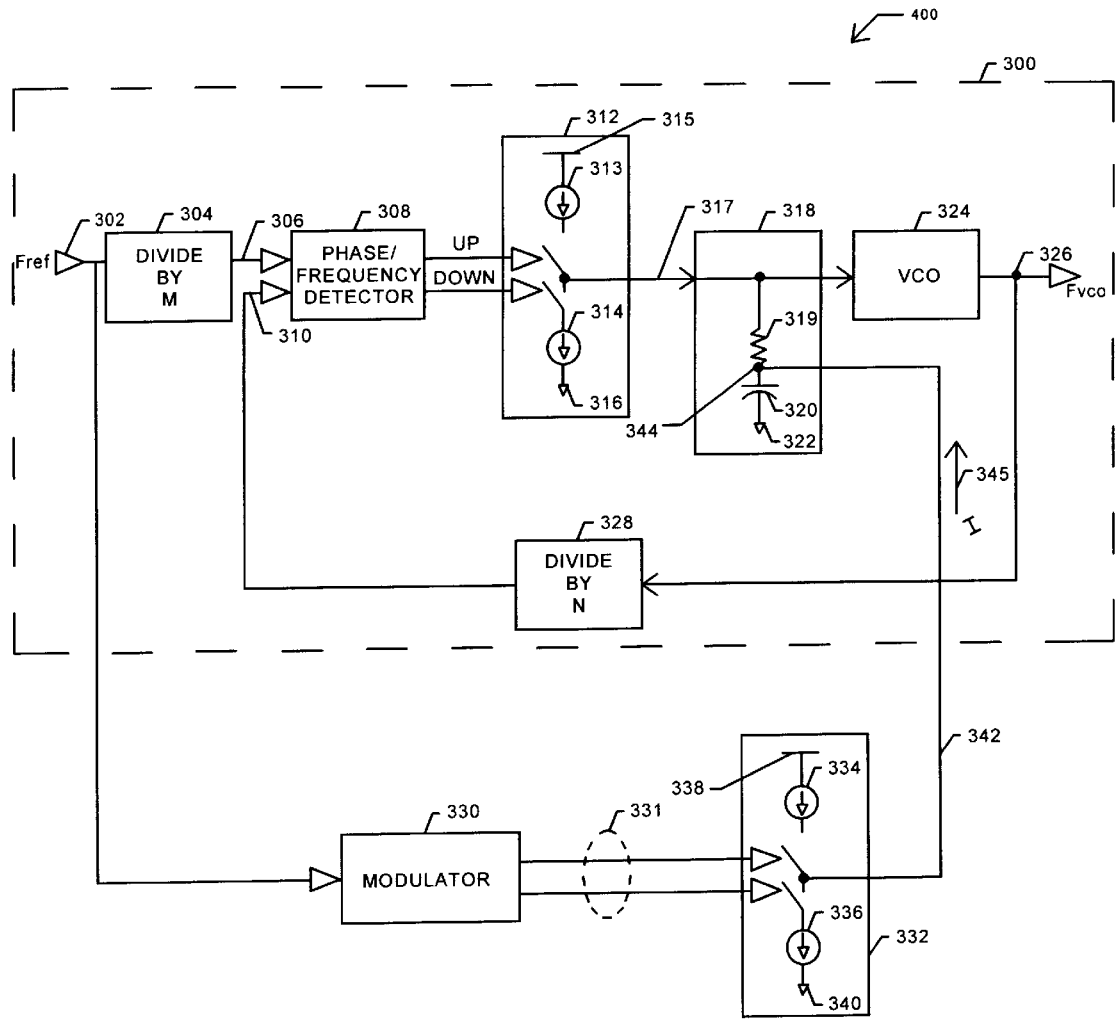
FIG. 4 is a simplified block diagram in accordance with one embodiment of the present invention.

FIG. 4 is a simplified block diagram illustrating one embodiment of the present invention. Elements appearing in FIG. 4 which were introduced in FIG. 3 are referred to with the same reference numerals which were originally used. A conventional PLL 300, similar to the one shown in FIG. 3, includes two signal dividers 304 and 328, a phase/frequency detector 308, a charge pump 312, a loop filter 318, and a VCO 324. Various designs can be utilized to implement the PLL 300. For example, the VCO 324 can be any type of oscillator, but preferably is a voltage controlled oscillator. The charge pump 312 can be selected from a variety of designs, but preferably includes two current source devices 313 and 314 connected in series between a voltage potential 315 and a ground potential 316 Alternatively, a signal generator with a control pin can be used in place of the PLL 300.

In FIG. 4, the phase/frequency detector 308 controls which one of the two current source devices 313 or 314 are connected to the charge pump output node 317. Accordingly, the phase/frequency detector 308 controls the input to the VCO 324 and adjusts the VCO output 326 in accordance with detected differences between the divided signal at node 306 and the feedback signal at node 310. In FIG. 4, the PLL 300 is responsible for maintaining the center frequency of the loop and phase-locking the output signal at node 326 with the input signal at node 302.

A modulator 330 is coupled to the input node 302 to receive the PLL input signal 302. The modulator 330 both generates the modulation profile and controls the modulation frequency. The modulation profile is preferably triangular. But, many profiles can be generated by, for example, modifying the amplitude profile of the charge pump currents during a selected modulation period. Modulator outputs 331 are coupled to a modulation charge pump 332. The modulation charge pump 332 can have any configuration, but preferably includes two current source devices 334 and 336 connected in series between a voltage potential 338 and a ground potential 340. The modulator 330 controls which one of the two current source devices 334 or 336 are connected to a modulation charge pump output 342. The modulation charge pump output 342 is coupled to a control node 344. As illustrated, the loop filter capacitor 320 is connected between the control node 344 and the ground potential 322. The loop filter capacitor 320 can be any potential storage device capable of storing a potential energy for a sufficient period.

Accordingly, the modulation charge pump 332 can inject a modulation current (I) 345 into the loop filter capacitor 320. Since the VCO output 326 responds to the voltage value across the loop filter 318, the charge stored in the loop filter capacitor 320 will control the VCO output 326. Thus, the modulation charge pump 332 can create a frequency excursion of the VCO output 326.

More specifically, since the voltage across the loop filter capacitor 320 is a time integral of the current charging the capacitor 320, the frequency excursion of the VCO 324 is proportional to the time integral of the modulation current 345 from the modulation charge pump 332. For example, a square current pulse train from the modulation charge pump 332 will create a VCO output 326 which is frequency modulated by a triangular wave. Likewise, a sinusoidal current waveform will create a sinusoidal frequency modulated VCO output 326, which will differ by 90 degrees and a constant of proportionality.

The modulation frequency generated by the modulator 330 is preferably at least ten times higher than the bandwidth of the phase locked loop. Such a configuration is desired because the conventional PLL tends to correct itself and bring itself back to lock. In this case, the PLL is never truly in lock because the voltage across the loop filter 318 is continuously changing to provide a frequency modulated signal comprising a multiplicity of frequencies within a spread spectrum.

By taking into account the gain of the VCO 324 in MHz/V, the value of the loop filter capacitor 320, and the modulation profile and frequency of the modulator 330, an exact value of the current needed from the modulation charge pump 332 can be calculated.

For example, consider the case where the objective is a +/−1 MHz deviation from the center frequency with a center frequency of 100 MHz, a VCO gain of 100 MHz/V, a loop filter capacitor value of 100 pF, and a modulation profile of 50 KHz square current pulse train. This means that in 10 μs (i.e., half the 50 KHz period) the VCO output 326 needs to deviate by about 2 MHz. This implies a 0.02 V change in the stored voltage of the loop filter capacitor 320 (or, 2 MHz divided by 100 MHz/V).

Figure 5A:
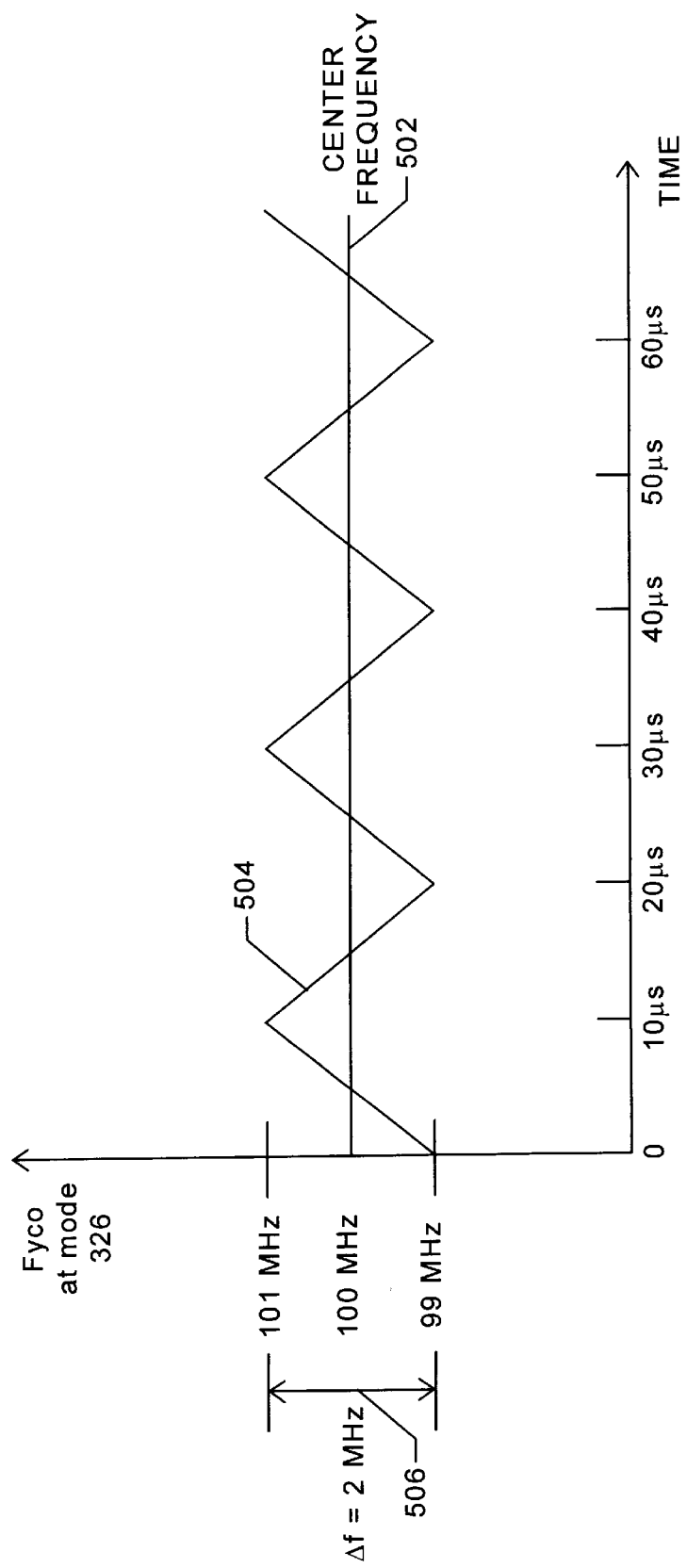
FIGS. 5A–C are timing diagrams illustrating examples in accordance with one embodiment of the present invention.
Figure 5B:
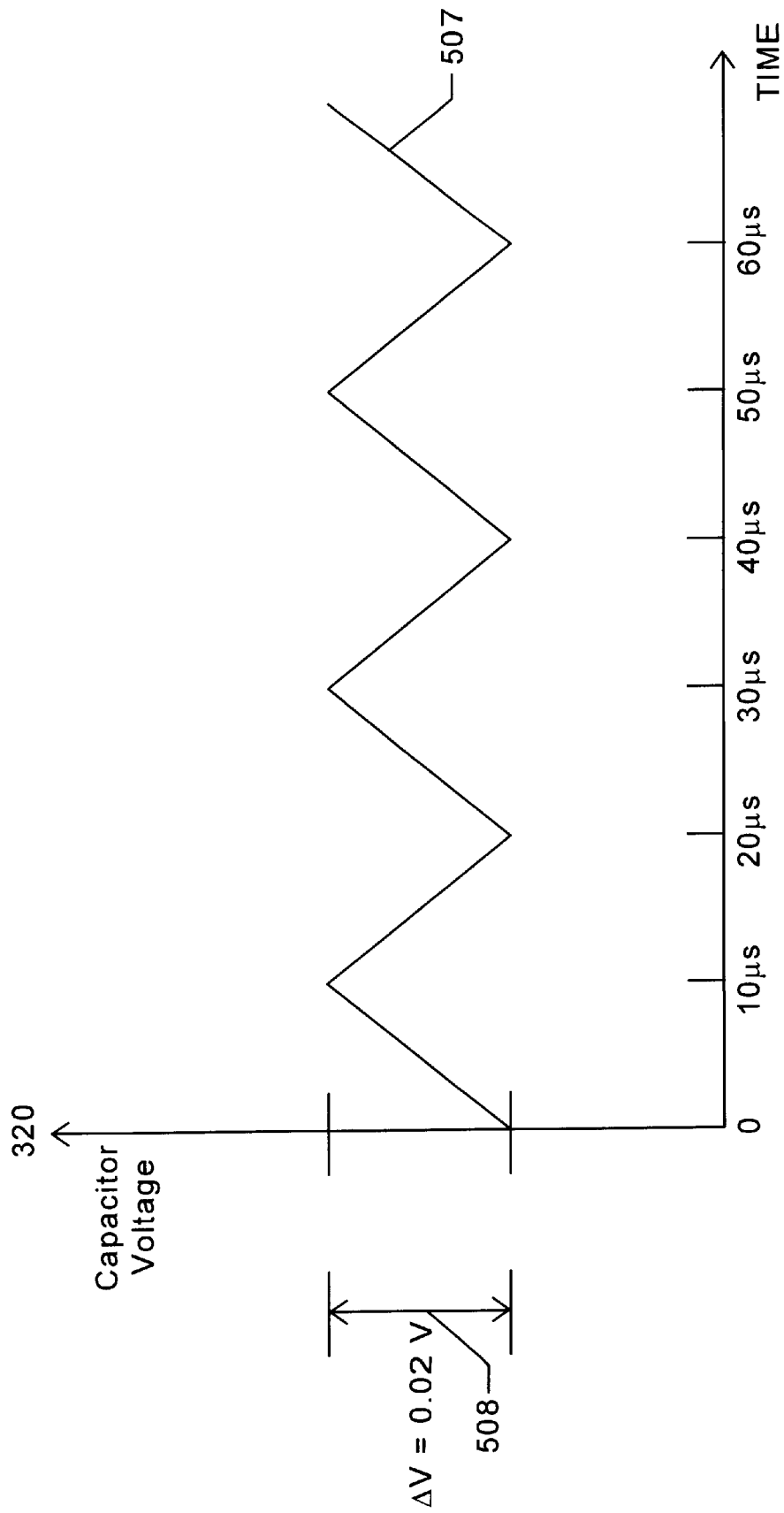
Figure 5C:
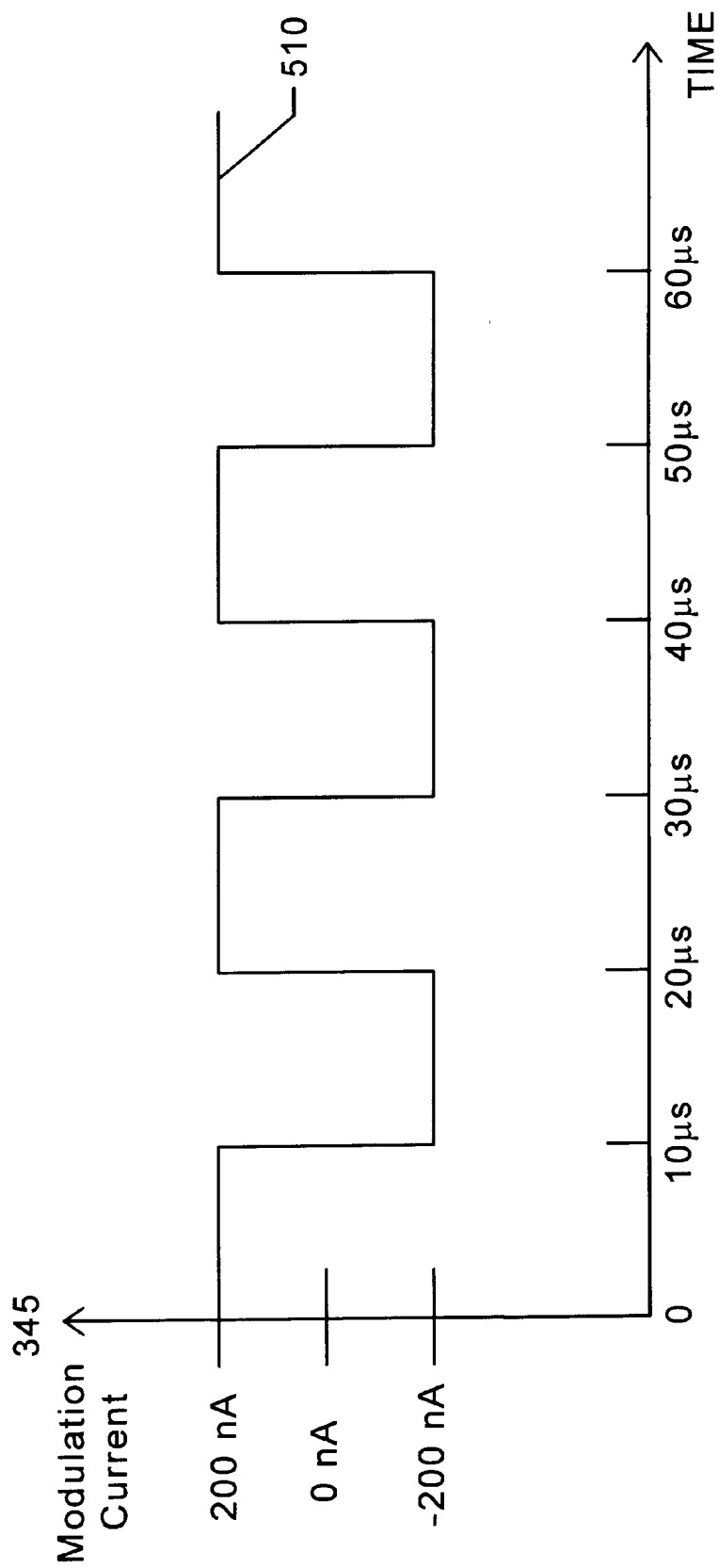

FIGS. 5A–C are timing diagrams for the above example. In FIG. 5A, line 502 illustrates the center frequency of 100 MHz. An output waveform 504 represents the VCO output at node 326. The output waveform 504 has a deviation of about +/−1 MHz in each 10 μs interval. The deviation totaling 2 MHz in each 10 μs interval is shown by a frequency change 506.

In FIG. 5B, a waveform 507 illustrates the voltage across the loop filter capacitor 320 for the values specified in the above example. A voltage change 508 illustrates the change in the voltage stored in the loop filter capacitor 320. As shown, the voltage change 508 amounts to 0.02 V in each 10 μs interval.

Utilizing the well known formula below for determining the voltage across a capacitor, one can calculate the required current for charging the loop filter capacitor 320 to the desired level for the above example.

$$dv/dt = I/C \quad (1.1)$$

In the above example, dv is 0.02 V, dt is 10 μs, and C is 100 pF. After plugging in the numbers in the above formula, we arrive at 200 nA for I. Therefore, a charging current of 200 nA from the modulation charge pump 332 is needed to produce the desired above frequency modulation.

In FIG. 5C, a waveform 510 illustrates the modulation current 345 for the above example. As shown, in each 10 μs interval, the modulation current 345 varies by about 400 nA.

As detailed above, the modulation charge pump 332 and modulator 330 alone are sufficient for frequency modulation and, hence, spreading the spectrum of the input signal. However, the VCO gain, capacitor value, and charge pump current vary by about 20% from process corner to corner, without taking the effects of temperature into account. Accordingly, another embodiment will be disclosed below which achieves higher accuracy, with a frequency deviation of about 0.1%.

Figure 6:
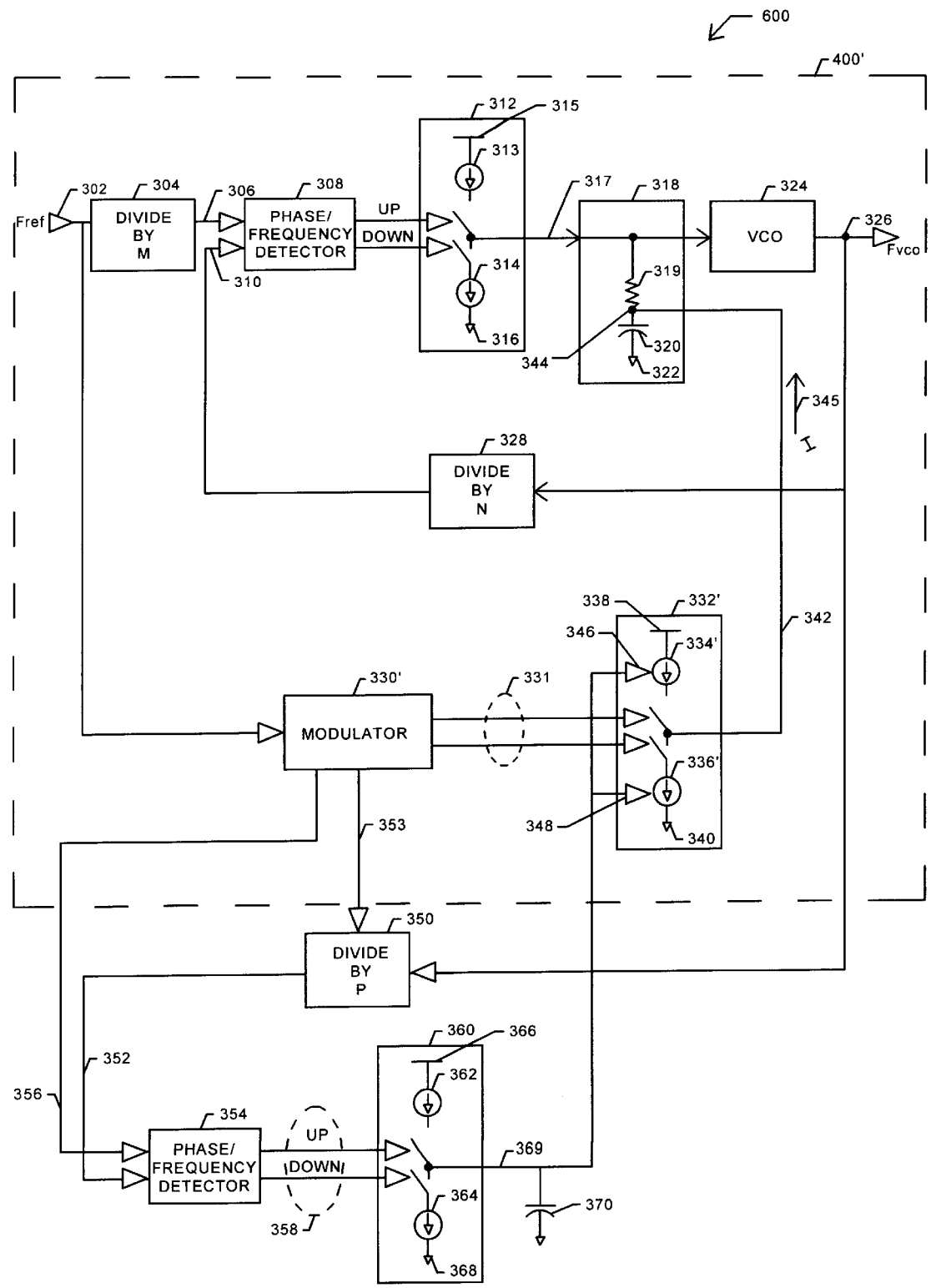
FIG. 6 is a simplified block diagram in accordance with another embodiment of the present invention.

FIG. 6 is a simplified block diagram in accordance with another embodiment of the present invention. Elements appearing in FIG. 6 which were introduced in FIGS. 3 and 4 are referred to with the same reference numerals which were originally used. A circuit 600 includes some of the components of the circuit 400 of FIG. 4, represented by block 400'. Some differences, however, exist between the circuit 400 and 400'. For example, the modulator 330 is replaced with a modulator 330' which generates at least two additional outputs. Also, the modulation charge pump 332' is modified to include two current source devices 334' and 336', connected in series between the voltage potential 338 and the ground potential 340. The current source devices 334' and 336' include control pins 346 and 348 for adjustment purposes.

An extra loop is added to the circuit 400' to detect the average frequency excursion of the frequency modulated VCO output 326. A third signal divider 350 is coupled to the VCO output node 326 and divides the output signal of the VCO by a factor P. The third signal divider 350 generates an output pulse on node 352 for every P input pulses. The third signal divider 350 also receives a signal from the modulator 330' on node 353. The modulator signal on node 353 indicates to the third signal divider 350 when to start counting the input pulses it receives from the VCO output 326. The third signal divider 350 provides its output on node 352 to a second phase/frequency detector 354.

The second phase/frequency detector 354 also receives a modulation frequency signal from the modulator 330' on node 356. The second phase/frequency detector 354 compares the phase and/or frequency of the signals on nodes 352 and 356 to generate outputs 358 to a control charge pump 360. The control charge pump 360 can have any configuration, but preferably includes two current source devices 362 and 364 connected in series between a voltage potential 366 and a ground potential 368.

Depending on when the third divider generates a signal on node 352, the control charge pump 360 generates either a pump up or pump down signal based on the phase/frequency detector output signals 358. This signal turns on either the current source device 362 or the current source device 364. The current source devices 362 and 364 charge or discharge a second capacitor 370. The second capacitor 370 can be any potential storage device capable of storing a potential energy for a sufficient period. The voltage stored in the second capacitor 370 adjusts the modulation current 345 by controlling the modulation charge pump 332'.

Accordingly, the control charge pump 360 through the second capacitor 370 provides a signal on node 369 to the current source control pins 346 and 348. And, the output of the control charge pump 360 controls the amplitude of the modulation current 345 into the loop filter capacitor 320, thereby completing the loop.

For further explanation of operation of the circuit 600, consider the example discussed above where the objective is a +/−1 MHz deviation from the center frequency with a center frequency of 100 MHz, and a modulation profile of 50 KHz square current pulse train. This means that in 10 μs (i.e., half the 50 KHz period) the VCO output 326 needs to deviate by about 2 MHz.

Figure 7A:
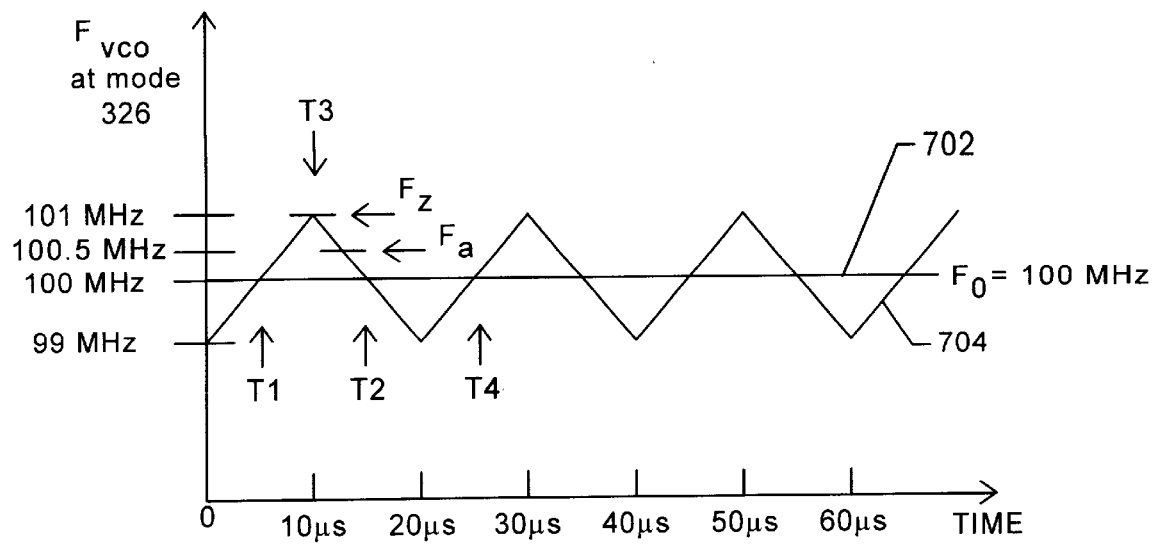
FIGS. 7A and 7B are timing diagrams illustrating examples in accordance with another embodiment of the present invention.
Figure 7B:
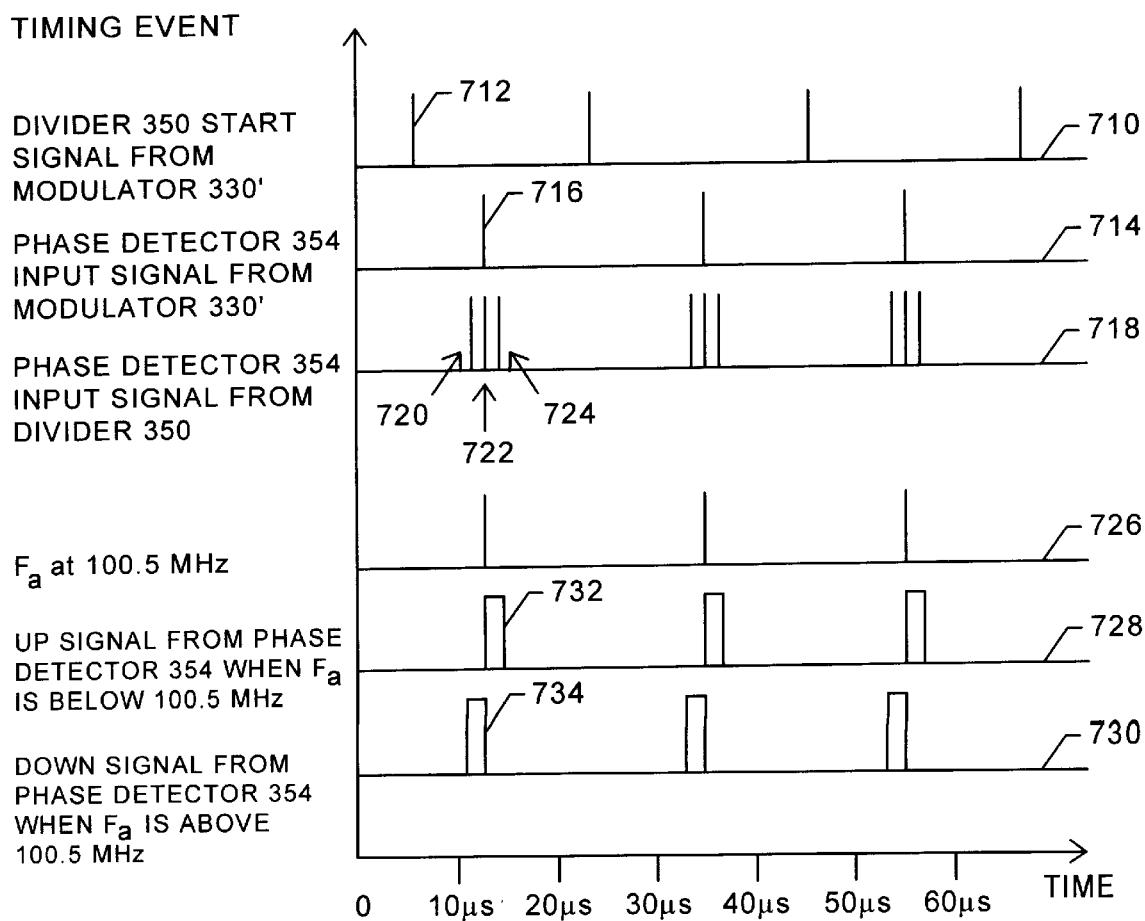

FIGS. 7A and 7B are timing diagrams for the above example which relate to the circuit 600. In FIG. 7A, a line 702 illustrates the center frequency of about 100 MHz. A waveform 704 illustrates the output of the VCO at node 326. If the third signal divider 350 is configured to count the frequency modulated VCO output 326 during a period between T1 and T2, the third signal divider output 352 will reveal the average frequency Fa during that period of time.

For example, if the third signal divider 350 is programmed to divide by 1000 starting at T1 and by T2 it outputs a pulse, then there are at least 1000 cycles present during this period. The period is calculated by deducting the value of T1 from T2, which is 10 μs in this example. Therefore, the average frequency during this period is 100 MHz, because 1000 cycles divided by 10 μs equals 100 MHz. If the third signal divider 350 generates an output pulse before or after T2, this will imply that the average frequency is above or below 100 MHz, respectively.

In case of triangular frequency modulation of the VCO output 326, the average frequency Fa is calculated by applying the following formula:

$$Fa=(Fz+Fo)/2, \qquad (1.2)$$

where Fz is the maximum frequency and Fo is the center frequency.

Therefore, for the example shown in FIG. 7A, where Fz is 101 MHz and Fo is 100 MHz, Fa is 100.5 MHz.

For sinusoidal frequency modulation of the VCO output 326, the average frequency Fa is calculated by applying the following formula;

$$Fa=[2Fz+Fo(pi-2)]/pi, \qquad (1.3)$$

where Fz is the maximum frequency and Fo is the center frequency.

FIG. 7B illustrates an exemplary timing diagram for the circuit 600 of FIG. 6, in accordance with the above example. Spikes on line 710 illustrate start signals for the third signal divider 350 generated by the modulator 330' on node 353. As shown, a first start signal 712 occurs at time T1 (i.e., 5 μs for the above example). Subsequent third counter 350 start signals occur at 25 μs, 45 μs, etc., for the above example.

Spikes on line 714 illustrate modulation pulses generated by the modulator 330' on node 356. These spikes are received by the second phase/frequency detector 354 on node 356. As shown, a first modulation pulse 716 occurs at time T2 (i.e., 15 μs for the above example). Subsequent modulation pulses occur at 35 μs, 55 μs, etc., for the above example.

Spikes on line 718 illustrate signals generated by the third signal divider 350 which are received by the second phase/frequency detector 354 on node 352. It is assumed that the third signal divider 350 is configured to count 1005 cycles before it outputs a pulse. For example, signal 720 is generated if the third signal divider 350 count occurs before time T2. This implies that the average frequency (Fa) is above 100.5 MHz. Signal 722 occurs if the average frequency (Fa) is at about 100.5 MHz. And, signal 724 occurs if the average frequency (Fa) is below 100.5 MHz.

Spikes on line 726 represent signals generated by the second phase/frequency detector 354 on outputs 358 when the average frequency (Fa) is at about 100.5 MHz. Bars on line 728 illustrate an "up signal" pulse 732 when the average frequency (Fa) is below 100.5 MHz. Bars on line 730 illustrate a "down signal" pulse 734 when the average frequency (Fa) is above 100.5 MHz. The "up signal" engages the current source device 362 to charge up the second capacitor 370. The "down signal" engages the current source device 364 to discharge the second capacitor 370. As discussed above, these adjustments will effect the VCO output 326.

More particularly, at the beginning of time T1, 5 μs, the pulse 712 is generated by the modulator 330' on node 353 to start the count on the third signal divider 350. The third signal divider 350 is preloaded with a count of 1005. As a result, it will generate its output pulse on node 352 after counting 1005 cycles of the VCO output 326. The phase/frequency detector 354 is turned off in both directions until a comparison takes place.

Assuming the VCO output 326 has a center frequency of 100 MHz and the modulation current at the control node 344 is only 100 nA, instead of the desired 200 nA, at time T3 of FIG. 7A, the maximum frequency (Fz) for the triangular waveform 704 will only be at about 100.5 MHz, instead of the desired 101 MHz. Since the center frequency is 100 MHz, the average frequency (Fa) during period of T1 to T2 will only be 100.25 MHz in accordance with formula 1.2.

At time T2, 10 μs after T1, the pulse 716 is generated by the modulator 330' on node 356, but this time for the phase/frequency detector 354. As discussed above, since the average frequency (Fa) of the VCO output 326 is at about 100.25 MHz in the 10 μs period, corresponding to 1002.5 cycles in 10 μs, the third divider will not generate an output pulse at time T2. This is because the third signal divider 350 is configured to count 1005 cycles before it outputs a pulse. In fact, the output pulse 724 from the third divider 330' on node 352 will occur 2.5 cycles behind the modulator output on node 356, or 2.5 cycles behind T2. Accordingly, the current source device 362 will generate a 2.5 cycle wide up-current pulse 732 to charge the second capacitor 370. Depending on the amplitude of the current source device 362 and the value of the second capacitor 370, the pulse 732 may not be enough to charge the second capacitor 370 to the desired value to adjust the modulation current 345 to 200 nA.

The subsequent comparisons can, however, incrementally adjust the modulation current 345 at the control node 344 such that the average frequency (Fa) of the VCO 324 reaches the desired 100.5 MHz during the period T1 to T2. At this point, the two inputs 352 and 356 to the second phase/frequency detector 354 will be aligned. Thus, neither up nor down current pulses will be generated on outputs 358, implying an average frequency (Fa) of the VCO output 326 at about 100.5 MHz, with the maximum frequency (Fz) at about 101 MHz during the period from T1 to T2.

If the average frequency (Fa) of the VCO output 326 is above 100.5 MHz, the output pulse 720 of FIG. 7B from the third signal divider 350 on node 352 will occur before time T2, the current source device 364 will generate a down current pulse 734 to discharge the voltage stored in the second capacitor 370. This will in turn reduce the modulation current 345 at the control node 344. Depending on the amplitude of the current source device 364 and the value of the second capacitor 370, the pulse 734 may not be enough to discharge the second capacitor 370 sufficiently. Further comparisons can, however, incrementally adjust the modulation current 345 such that the average frequency (Fa) of the VCO 324 approaches the desired value.

Occasionally, a small up-current pulse may occur to compensate for the leakage current of the second capacitor 370. During the period from T2 to T4, the third signal divider 350 stays idle and no adjustment is made. At time T4, the cycle of events restart again as discussed above.

In practice, the modulation current at node 344 may not be exactly 200 nA because of uncertainties in values of the circuit components, such as the gain of the VCO 324, the values of capacitors 320 and 370, etc. But, as discussed above, the present invention can compensate for any such uncertainties by adjusting the modulation current 345 at node 344. Similarly, any changes in power supply and temperature will also be tracked by the present invention. Moreover, the third signal divider 350 may be simply loaded with a different value if a different frequency deviation is desired.

To further improve the resolution of the frequency excursion, the third signal divider 350 can be preloaded with a substantially larger count than can be counted during a single cycle period of the output signal 326, such as 10005 for the example above. The third signal divider 350 would then have to count multiple selected periods, such as the half-cycle period from T1 to T2. In this embodiment, the counting operation by the third signal divider 350 may have to be stopped and resumed multiple times to ensure that a signal is generated on node 352.

The present invention has been implemented with a commercially available 0.5 μm CMOS process. The peak energy of the fundamental and all its harmonics have been lowered by at least 10 dB when compared with the same silicon in a non-spread frequency mode. Additionally, the frequency deviation is within an accuracy of about 0.1%.

As will be understood by those with ordinary skill in the art, the present invention may be embodied in other specific forms without departing from the spirit or essential characteristics thereof. For example, a digitally programmed device may control the injection of the modulating current. Alternately, any signal, other than a clock signal, may be frequency modulated using the present invention. Accordingly, for an understanding of the scope of the invention, reference should be made to the appended claims.

What is claimed is:

1. An apparatus for spreading a frequency spectrum of a reference signal comprising:
    a phase-locked loop circuit configured to receive the reference signal and to generate an output signal; and
    a modulating circuit coupled to the phase-locked loop, configured to receive the reference signal and to generate a modulating signal based on the reference signal, the phase-locked loop configured to vary the frequency spectrum of the output signal in accordance with a value of the modulating signal,
    wherein the phase-locked loop includes a potential storage device configured to receive the modulating signal, the modulating circuit configured to charge and discharge the potential storage device in accordance with the modulating signal.

2. The apparatus of claim 1 wherein the potential storage device is a capacitor.

3. The apparatus of claim 1 wherein the phase-locked loop further includes an oscillator coupled to the potential storage device and configured to generate the output signal in accordance with a stored potential value in the potential storage device.

4. The apparatus of claim 3 wherein the oscillator is a voltage controlled oscillator.

5. An apparatus for spreading a frequency spectrum of a reference signal comprising:
    a phase-locked loop circuit configured to receive the reference signal and to generate an output signal; and
    a modulating circuit coupled to the phase-locked loop, configured to receive the reference signal and to generate a modulating signal based on the reference signal, the phase-locked loop configured to vary the frequency spectrum of the output signal in accordance with a value of the modulating signal, wherein the modulating circuit includes:
        a modulator configured to receive the reference signal and to generate a modulation control signal; and
        a modulation charge pump coupled to the modulator and configured to receive the modulation control signal, the charge pump generating the modulating signal.

6. The apparatus of claim 5 wherein the modulation charge pump includes at least two current source devices coupled in series between a first and second voltage potentials.

7. An apparatus for spreading a frequency spectrum of a reference signal comprising:
    a phase-locked loop circuit configured to receive the reference signal and to generate an output signal;
    a modulating circuit coupled to the phase-locked loop, configured to receive the reference signal and to generate a modulating signal based on the reference signal, the phase-locked loop configured to vary the frequency spectrum of the output signal in accordance with a value of the modulating signal;
    a signal divider coupled to the phase-locked loop and the modulating circuit, the signal divider configured to receive the output signal and a start signal generated by the modulating circuit, the modulating circuit start signal indicating when the signal divider should begin counting pulses present in the output signal, the signal divider generating an output indicative of an average value of a frequency of the output signal; and
    a signal detector coupled to the modulating circuit and the signal divider, the signal detector configured to generate a control signal based on comparing the signal divider output signal and a modulation frequency signal from the modulating circuit, the phase-locked loop configured to adjust the modulating signal in accordance with the signal detector control signal.

8. The apparatus of claim 7 further including a control charge pump coupled to the modulating circuit and the signal detector, configured to receive the signal detector control signal and to generate a pump signal, the phase-locked loop configured to adjust the modulating signal in accordance with the pump signal.

9. The apparatus of claim 8 wherein the control charge pump includes at least two current source devices coupled in series between a first and second voltage potentials.

10. The apparatus of claim 8 further including a potential storage device coupled to the modulating circuit and the control charge pump, configured to receive the pump signal, the control charge pump configured to charge and discharge the potential storage device in accordance with the pump signal, the modulating circuit configured to adjust the modulating signal in accordance with a value of potential stored in the potential storage device.

11. The apparatus of claim 10 wherein the potential storage device is a capacitor.

12. An circuit for spreading a frequency spectrum of a reference signal comprising:
    a phase-locked loop circuit configured to receive the reference signal and to generate an output signal;
    a modulator configured to receive the reference signal and to generate a modulation control signal;
    a modulation charge pump coupled to the modulator and configured to receive the modulation control signal, the charge pump generating a modulating signal;
    a first potential storage device coupled to the modulation charge pump, configured to receive the modulating signal, the charge pump configured to charge and discharge the first potential storage device in accordance with the modulating signal;
    a signal divider coupled to the phase-locked loop and the modulator, the signal divider configured to receive the output signal and a start signal generated by the modulator, the modulator start signal indicating when the signal divider should begin counting pulses present in the output signal, the signal divider generating an output indicative of an average value of a frequency of the output signal;

a signal detector coupled to the modulator and the signal divider, the signal detector configured to generate a control signal based on comparing the signal divider output signal and a modulation frequency signal from the modulator;

a control charge pump coupled to the modulation charge pump and the signal detector, configured to receive the signal detector control signal and to supply a pump signal to the modulation charge pump; and a second potential storage device coupled to the modulation charge pump and the control charge pump, configured to receive the pump signal, the control charge pump configured to charge and discharge the second potential storage device in accordance with the pump signal, the modulation charge pump configured to adjust the modulating signal in accordance with a value of potential stored in the second potential storage device.

13. A method for spreading a frequency spectrum of a reference signal comprising:

receiving the reference signal;

deriving an output signal from the reference signal by locking onto a characteristic of the reference signal, wherein the reference signal characteristic is selected from a group comprising signal phase and signal frequency;

deriving a modulating signal from the reference signal; controlling a frequency spectrum of the output signal in accordance with the modulating signal;

generating a count pulse for a count signal whenever a selected number of cycles of the output signal is reached during a first period;

deriving a modulation frequency signal from the reference signal;

generating a detector control signal based on a comparison of the count signal and the modulation frequency signal; and controlling the modulating signal based on the detector control signal.

14. The method of claim 13 wherein the locking act includes charging and discharging a potential storage device, and further including additional charging and discharging of the potential storage device in accordance with a value of the modulating signal, wherein a value of stored potential in the potential storage device adjusts the modulating signal.

15. The method of claim 14 wherein the potential storage device is a capacitor.

16. The method of claim 13 wherein the first period is about a half-cycle of the output signal.

17. The method of claim 13 further including:

counting cycles of the output signal during the first period; and resetting the value of the selected number of cycles for generating the count pulse after a second period.

18. The method of claim 17 wherein the first and second periods constitute about a full cycle of the output signal.

19. The method of claim 13 wherein the value of the selected number of cycles for generating the count pulse is substantially large to disable generation of the count pulse within a full cycle of the output signal.

20. The method of claim 19 further including:

counting cycles of the output signal during the first period;

stopping the counting of cycles of the output signal during a second period;

resuming the counting of cycles of the output signal during a third period; and resetting the value of the selected number of cycles for generating the count pulse after a selected number of the output signal cycles have occurred to increase a resolution for spreading the frequency spectrum.

21. The method of claim 20 wherein the first and second periods constitute about a full cycle of the output signal.

22. The method of claim 20 wherein the third period is about a half-cycle of the output signal.

23. The method of claim 20 wherein the selected number of the output signal cycles is determined by a ratio of the value of the selected number of cycles for generating the count pulse and a cycle period of the output signal.

24. The method of claim 13 further including dividing and multiplying the reference signal to generate the output signal.

* * * * *